(12) United States Patent
Kurjanowicz et al.

(10) Patent No.: US 8,369,166 B2
(45) Date of Patent: Feb. 5, 2013

(54) REDUNDANCY SYSTEM FOR NON-VOLATILE MEMORY

(75) Inventors: Wlodek Kurjanowicz, Arnprior (CA); Mourad Abdat, Ottawa (CA)

(73) Assignee: Sidense Corp., Ottawa, Ontario (CA)

(*) Notice: Subject to any disclaimer, the term of this patent is extended or adjusted under 35 U.S.C. 154(b) by 256 days.

(21) Appl. No.: 12/843,498

(22) Filed: Jul. 26, 2010

(65) Prior Publication Data
US 2011/0019491 A1    Jan. 27, 2011

Related U.S. Application Data

(60) Provisional application No. 61/228,704, filed on Jul. 27, 2009.

(51) Int. Cl.
*G11C 29/00* (2006.01)
(52) U.S. Cl. .................................... 365/200; 365/201
(58) Field of Classification Search .............. 365/200, 365/201
See application file for complete search history.

(56) References Cited

U.S. PATENT DOCUMENTS

| | | | |
|---|---|---|---|
| 5,857,069 A | 1/1999 | Kohler | |
| 6,421,799 B1 | 7/2002 | Ferrant | |
| 6,570,795 B1 | 5/2003 | Fricke | |
| 6,667,902 B2 | 12/2003 | Peng | |
| 6,944,083 B2 | 9/2005 | Pedlow | |
| 7,003,713 B2 | 2/2006 | Rodgers | |
| 7,047,381 B2 | 5/2006 | Bushner | |
| 2003/0174566 A1* | 9/2003 | Furutani et al. | 365/201 |
| 2005/0088887 A1* | 4/2005 | Wang | 365/201 |
| 2006/0256633 A1* | 11/2006 | Louie et al. | 365/201 |
| 2007/0133325 A1* | 6/2007 | Kwon et al. | 365/201 |
| 2007/0230261 A1* | 10/2007 | Haufe et al. | 365/201 |
| 2008/0130386 A1* | 6/2008 | Pyeon | 365/201 |

FOREIGN PATENT DOCUMENTS

| | | |
|---|---|---|
| CA | 2424211 A1 | 10/2003 |
| WO | 2008077237 A1 | 7/2008 |

OTHER PUBLICATIONS

Canadian Patent Application No. 2,708,593, Office Action dated Dec. 9, 2010.
International Application No. PCT/CA2010/001146, Search Report dated Nov. 5, 2010.

* cited by examiner

*Primary Examiner* — Michael Tran
(74) *Attorney, Agent, or Firm* — Shin Hung; Borden Ladner Gervais LLP

(57) ABSTRACT

A redundancy scheme for Non-Volatile Memories (NVM) is described. This redundancy scheme provides means for using defective cells in non-volatile memories to increase yield. The algorithm is based on inverting the program data for data being programmed to a cell grouping when a defective cell is detected in the cell grouping. Defective cells are biased to either "1" or "0" logic states, which are effectively preset to store its biased logic state. A data bit to be stored in a defective cell having a logic state that is complementary to the biased logic state of the cell results in the program data being inverted and programmed. An inversion status bit is programmed to indicate the inverted status of the programmed data. During read out, the inversion status bit causes the stored data to be re-inverted into its original program data states.

9 Claims, 14 Drawing Sheets

| Original Program Data | Memory Array Test Results | Memory Array after Pre-programming | Final Programmed Data |
|---|---|---|---|
| 11010100 | 0000x000.0 | 00001000.0 | 00101011.1 |
| 10101001 | 00000000.0 | 00000000.0 | 10101001.0 |
| 11100101 | 0000x000.0 | 00001000.0 | 00011010.1 |
| 00101010 | 00000000.0 | 00000000.0 | 00101010.0 |
| 10100010 | 00000000.0 | 00000000.0 | 10100010.0 |
| 10111010 | 00x00000.0 | 00100000.0 | 10111010.0 |
| 10101110 | 00000000.0 | 00000000.0 | 10111110.0 |
| 00001001 | 00000000.0 | 00000000.0 | 00001001.0 |
| 10110101 | 000000x0.0 | 00000010.0 | 10110101.0 |
| 01010101 | 00000000.0 | 00000000.0 | 01010101.0 |
| 11111100 | 00000000.0 | 00000000.0 | 11111100.0 |
| 00101111 | 0000x000.0 | 00001000.0 | 00101111.0 |
| 10110111 | 0000x000.0 | 00001000.0 | 01001000.1 |
| 11101010 | 00000000.0 | 00000000.0 | 00010101.1 |
| 00111101 | 00000000.x 200 / [00000000.0] | 00000000.1 | 00111101.0 } 202 / 201 |

FIG. 14

| Original Program Data | Memory Array Test Results | Memory Array after Pre-programming | Final Programmed Data |
|---|---|---|---|
| 11010100 10010101 | 0000x000 000x0000.00 | 00001000 00010000.00 | 00101011 10010101.10 |
| 10101001 00010101 | 00000000 0000000x.x0 | 00000000 00000001.10 | 01010110 00010101.10 |
| 11100101 11001100 | 0000x000 00000000.00 | 00001000 00000000.00 | 00011010 11001100.10 |
| 00101010 00001111 | 00000000 00000000.xx | 00000000 00000000.11 | 11010101 11110000.11 |
| 10100010 00000000 | 00000000 00000000.00 | 00000000 00000000.00 | 10100010 00000000.00 |
| 10011010 11110001 | 00x00000 x0000000.00 | 01000000 10000000.00 | 10111010 11110001.00 |
| 10101101 10101101 | 00000000 00000000.00 | 00000000 00000000.00 | 10101110 10101101.00 |
| 00001001 00101011 | 0000000x x0000000.00 | 00000001 10000000.00 | 00001001 00101011.00 |
| 10101101 11100010 | 00000000 00000000.00 | 00000000 00000000.00 | 10110101 11100010.00 |
| 01010101 10100000 | 00000000 00000000.x0 | 00000000 00000000.10 | 01010101 10100000.00 |
| 11101100 00001110 | 0000x000 00000000.x0 | 00001000 00000000.10 | 00000011 00001110.10 |
| 00101111 00001010 | 00000000 00000000.00 | 00000000 00000000.00 | 00101111 11110101.01 |
| 10110111 11111111 | 0000x000 00000000.00 | 00001000 00000000.00 | 01001000 11111111.10 |
| 11101010 00000001 | 00000000 00000000.0x | 00000000 00000000.01 | 11101010 11111110.01 |
| 00111101 01011100 | 00000000 00000000.00 | 00000000 00000000.00 | 00111101 01011100.00 |

| Original Program Data | Detected Leaky Cells | Detected Weak Cells | Final Programmed Data |
|---|---|---|---|
| 11010100 | 000x0000.0 | 00000000.0 | 11010100.0 |
| 10101001 | 0000000x.0 | 00000000.0 | 10101001.0 |
| 11100101 | 00000000.0 | y0000000.0 | 00011010.1 |
| 00101010 | 00000000.x | 00000000.0 | 11010101.1 |
| 10100010 | 000000x.0 | 00000000.0 | 01011101.1 |
| 10111010 | x0000000.0 | 00000000.0 | 10111010.0 |
| 10101110 | 00000000.0 | 0000y000.0 | 10101110.0 |
| 00001001 | 00000000.0 | 00000000.0 | 11110110.1 |
| 10110101 | x0000000.0 | 00000000.0 | 10110101.0 |
| 01010101 | 00000000.0 | 00000000.0 | 01010101.0 |
| 11111100 | 00000000.0 | y0000000.0 | 00000011.1 |
| 00101111 | 000000x.0 | 00000000.0 | 00101111.0 |
| 10110111 | 00000000.0 | 00000000.0 | 10110111.0 |
| 11101010 | 00000000.0 | 00000000.0 200 | 11101010.0 |
| 00111101 | 00000000.0 } 202 | [00000000.0] } 202 | 11000010.1 } 202 |
|  | } 201 | 00y00000.0 } 201 |  } 201 |

FIG. 16

REDUNDANCY SYSTEM FOR NON-VOLATILE MEMORY

CROSS REFERENCE TO RELATED APPLICATIONS

This application claims the benefit of priority of U.S. Provisional Patent Application No. 61/228,704 filed Jul. 27, 2009, which is incorporated herein by reference in its entirety.

FIELD OF THE INVENTION

The present invention relates generally to non-volatile memories. More particularly, the present invention relates to a redundancy scheme for non-volatile memories.

BACKGROUND OF THE INVENTION

Anti-fuse memories are considered a non-volatile memory in which data is retained in the memory cell in the absence of power. An anti-fuse device is a structure alterable to a conductive state, or in other words, an electronic device that changes state from non-conducting to conducting. Equivalently, the binary states can be either one of high resistance and low resistance in response to electric stress, such as a programming voltage or current. Unlike other forms of non-volatile memory such as flash, ferro-electric and magnetic memories, the anti-fuse programming is intended to be irreversible. Hence anti-fuse memories are referred to as one time programmable (OTP) memories.

A DRAM-type memory array using a planar capacitors as an anti-fuse instead of as a storage capacitor is already known, as demonstrated in U.S. Pat. No. 6,667,902. FIG. 1 is a circuit diagram of such a memory cell, while FIGS. 2 and 3 show the planar and cross-sectional views respectively, of the known anti-fuse memory cell of FIG. 1. The memory cell of FIG. 1 includes a pass, or access transistor 10 for coupling a bitline BL to a bottom plate of anti-fuse device 12. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low cost CMOS process.

According to an embodiment of the present invention, FIG. 4A shows a cross-sectional view of an anti-fuse transistor that can be manufactured with any standard CMOS process. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4A is taken along line B-B' of FIG. 4, being along the channel length of the device, which in the presently described embodiment is a p-channel device. Those of skill in the art will understand that the present invention can be implemented as an n-channel device.

Anti-fuse transistor 100 includes a variable thickness gate oxide 102 formed on the substrate channel region 104, a polysilicon gate 106, sidewall spacers 108, a field oxide region 109 a diffusion region 110, and an LDD region 114 in the diffusion region 110. A bitline contact 116 is shown to be in electrical contact with diffusion region 110. The variable thickness gate oxide 102 consists of a thick oxide and a thin gate oxide such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 110 on the other hand, defines an access edge where gate oxide breakdown is prevented and current between the gate 106 and diffusion region 110 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In a preferred embodiment, the diffusion region 110 is connected to a bitline through a bitline contact 116, or other line for sensing a current from the polysilicon gate 106, and can be doped to accommodate programming voltages or currents. This diffusion region 110 is formed proximate to the thick oxide portion of the variable thickness gate oxide 102. To further protect the edge of anti-fuse transistor 100 from high voltage damage, or current leakage, a resistor protection oxide (RPO), also known as a salicide protect oxide, can be introduced during the fabrication process to further space metal particles from the edge of sidewall spacer 108. This RPO is preferably used during the salicidiation process for preventing only a portion of diffusion region 110 and a portion of polysilicon gate 106 from being salicided.

It is well known that salicided transistors are known to have higher leakage and therefore lower breakdown voltage. Thus having a non-salicided diffusion region 110 will reduce leakage. Diffusion region 110 can be doped for low voltage transistors or high voltage transistors or a combination of the two resulting in same or different diffusion profiles.

A simplified plan view of the anti-fuse transistor 100 is shown in FIG. 4B. Bitline contact 116 can be used as a visual reference point to orient the plan view with the corresponding cross-sectional view of FIG. 4A. The active area 118 is the region of the device where the channel region 104 and diffusion region 110 is formed, which is defined by an OD mask during the fabrication process. The dashed outline 120 defines the areas in which the thick gate oxide is to be formed via an OD2 mask during the fabrication process. More specifically, the area enclosed by the dashed outline 120 designates the regions where thick oxide is to be formed. OD simply refers to an oxide definition mask that is used during the CMOS process for defining the regions on the substrate where the oxide is to be formed, and OD2 refers to a second oxide definition mask different than the first.

Programming of anti-fuse transistor 100 is based on gate oxide breakdown to form a permanent link between the gate and the channel underneath. Gate oxide breakdown conditions (voltage or current and time) depend primarily on i) gate dielectric thickness and composition, ii) defect density, and iii) gate area, gate/diffusion perimeter. The combined thick and thin gate oxide of anti-fuse transistor 100 results in a locally lowered gate breakdown voltage, in particular an oxide breakdown zone, in the thin gate oxide portion of the device. Anti-fuse transistor 100 is but one type of anti-fuse device which can be used in an OTP memory. Those skilled in the art will understand that different types of anti-fuse devices are programmed in a similar manner.

As with any fabricated semiconductor memory device, random defects can occur during manufacturing. More specifically, memory cells can suffer from physical defects that alter its characteristics. Such defects can render the OTP memory inoperable, since data may not be reliably stored in the defective cells. In a newly manufactured anti-fuse memory array, all the cells should be read as having an unprogrammed logic state. For example, an unprogrammed state logic state can correspond to a "0". However, due to manufacturing defects, some of the anti-fuse cells will leak current. In the present example, anti-fuse cells which leak current will read as a logic "1" state, which corresponds to a programmed state of the cell. These types of defective cells are referred to as leaky cells. Conversely, some anti-fuse cells may be difficult to program, thereby reading out a logic "0" state when it should be reading out as a logic "1" state. These types of defective cells are referred to as weak cells.

In order to improve overall manufacturing yield, redundancy schemes have been developed to repair memory arrays having defective cells. A well known redundancy technique of replacing rows and/or columns containing a defective cell with spare rows and/or columns can be used. However, such techniques introduce significant logic overhead for re-routing addresses while trying to ensure transparent operation and minimum diminished performance to the end user.

Examples of prior redundancy schemes are disclosed in the following US patents. In U.S. Pat. No. 6,421,799, a redundant ROM stores parity bits for rows and columns of main memory. A testing circuit calculates a parity for each row and column. In U.S. Pat. No. 6,944,083 a good copy of the sensitive data is stored in a different physical location. If tampering of memory is detected by comparing data stored in main memory with data stored in redundancy, data in the main memory is identified as unusable and data retrieved from redundant memory is used instead. In U.S. Pat. No. 7,047,381 multistage programming is implemented in the OTP array with use of the redundant rows. In U.S. Pat. No. 7,003,713 an OTP module receives encoded host data from the host integrated circuit and provides a copy of corrected host data to the host integrated circuit.

Most redundancy schemes require significant additional logic, which ultimately increases the chip area or macro footprint. Therefore a new redundancy scheme that minimizes logic overhead while maximizing overall yield is needed.

SUMMARY OF THE INVENTION

In a first aspect, there is provided a redundancy method for a non-volatile memory. The method includes identifying a memory cell of a cell group having a defect, and programming an inverted version of data to be stored in the cell group when the memory cell has a preset logic state mismatching a bit of the data to be stored in the memory cell. In one embodiment, the method can further include after identifying, detecting the bit of the data by comparing the preset logic state of the memory cell to a logic state of the bit of the data, and the preset logic state mismatches the bit of the data when the preset logic state corresponds to a programmed state and the bit of the data inhibits programming of the memory cell.

In another embodiment of the present aspect, the cell grouping includes a data cell group for storing program data and an inversion status cell for storing an inversion status bit, where programming can include inverting the program data and the inversion status bit. Either the memory cell having the defect is one of the data cell group, or the memory cell having the defect is the inversion status cell. In the present embodiment, when programming includes inhibiting programming of the memory cell, inhibiting includes re-inverting the bit of the data to be stored in the memory cell prior to programming to inhibit programming of the memory cell.

In the present embodiments, the method can include reading the inverted version of the data stored in the cell group, which includes detecting the inversion status bit having a logic level indicating the data cell group stores an inverted version of the data. Detecting includes re-inverting the inverted version of the data when the inversion status bit having the logic level is detected.

In yet another embodiment of the present aspect, identifying is executed during programming of data to the cell group before programming the inverted version of the data, and includes determining that the memory cell is unprogrammable. Determining includes reversing the programming of the data to the cell group after the memory cell is determined to be unprogrammable.

In a second aspect, there is provided a redundancy method for a non-volatile memory (NVM). The method includes reclaiming a defective cell a cell group of NVM cells, storing program data in the cell group, setting an inversion status cell, and providing read data from the cell group. Reclaiming is achieved by setting the defective cell to a permanent logic state. In storing the program data, the program data is inverted relative to input data received by the NVM if the permanent logic state of the defective cell and a logic state of a bit of the input data to be stored in the defective cell mismatch. Setting includes setting the inversion status cell to a predetermined logic state when the program data is inverted relative to the input data. In providing the read data, the read data is inverted if the inversion status cell stores the predetermined logic state. In an embodiment of the present aspect, unprogrammed cells store a first logic state and programmed cells store a second logic state, and the defective cell functions as a programmed cell. Reclaiming then includes programming the defective cell to store the second logic state as the permanent logic state, and setting the inversion status cell then includes programming the inversion status cell to store the second logic state as the predetermined logic state.

In a third aspect, there is provided a non-volatile memory. The non-volatile memory includes n cells for storing an n-bit entry and an inversion status cell. The n cells store an n-bit entry where a defective cell of the n cells is settable to a permanent logic state, where n is an integer value of at least 1. The inversion status cell is programmable from a default first logic state to a second logic state when the n cells store program data inverted relative to input data received by the non-volatile memory. In an embodiment of the present aspect, the non-volatile memory further includes a data register. The data register inverts the input data into the program data in response to a mismatch between the permanent logic state of the defective cell and a logic state of a bit of the input data to be programmed to the defective cell, and inverts read data from the n cells when the inversion status cell stores the second logic state. The data register includes n register cells and an inversion register cell. The n register cells correspond to each of the n cells for storing a bit of the input data and a bit of the read data. Each of the n register cells inverts the bit of the input data in response to a program inversion signal and inverts the bit of the read data in response to a read inversion signal. The inversion register cell corresponds to the inversion status cell, and provides the program inversion signal in response to the mismatch between the permanent logic state of the defective cell and a logic state of a bit of the input data to be programmed to the defective cell.

According to the present embodiment, each of the n register cells includes a first latch circuit for storing the bit of the input data, and a second latch circuit for storing the bit of the read data. In alternatives to the present embodiment, each of the n register cells can include a program data inversion circuit for inverting the bit of the input data in response to the program inversion signal; a read data inversion circuit for inverting the bit of the read data in response to the read inversion signal; or a data mismatch comparison logic for comparing the bit of the input data to the bit of the read data to provide a defect signal indicative of the mismatch.
In another alternative to the present embodiment, the inversion register cell includes a first latch circuit storing by default the second logic state, and a second latch circuit for storing an inversion status bit stored in the inversion status cell. The inversion status register cell provides an output from a sense amplifier coupled to the inversion status cell as the read inversion signal. The inversion status register cell can alternately include defect detection logic for providing the program inversion signal in response to detecting the second logic state of the inversion status cell or a defect signal indicative of the mismatch between the permanent logic state of the defective cell and a logic state of the bit of the input data to be programmed to the defective cell. The inversion status register cell can further include
a reset circuit for setting the first latch circuit to store the second logic state, and a program data inversion circuit for inverting the bit of the input data in response to the program inversion signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 14 is an example showing the presently described redundancy technique applied to a memory array;

FIG. 16 is another alternate example showing the presently described redundancy technique applied to a memory array;

DETAILED DESCRIPTION

Generally, the present invention provides a redundancy scheme for non-volatile memories, such as OTP or electrically erasable memories such as EPROM and Flash memories. The redundancy scheme uses defective cells in non-volatile memories to increase yield by using the defective cells to store data. The algorithm can be made transparent for user application during programming and during read operations. After manufacturing, an array clean test is performed prior to shipment of the memory devices. This test identifies those memory cells which tend to leak more than the allowed design permits. The identified leaky cells are programmed as logic "1" states, since they are read out as logic "1" states in the unprogrammed state. Alternately, cells which are difficult to program are retained as logic "0" states, since they cannot be programmed to the logic "1" state. Hence these defects are referred to as biased logic states of the cells. Each grouping of cells being an 8-bit word or a word having any number of bits, includes at least one additional cell used as an inversion status tag bit to indicate that the stored data entry uses a biased logic state to store a bit of the data entry.

Figure 5:
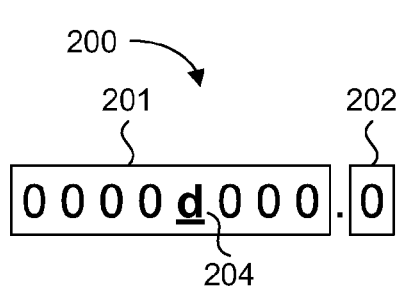
FIG. 5 is a drawing illustrating an n-bit entry having a defective cell and its corresponding inversion status bit, according to a present embodiment.

The general principle of the presently described redundancy technique is now discussed with reference to FIG. 5. FIG. 5 is a drawing illustrating a cell group 200 consisting of an n-bit data cell group 201, where n can be any integer value greater than 1, and a corresponding inversion status cell 202. The cell group 200 stores data, which consists of program data and an inversion status bit. In the present example of FIG. 5, data cell group 201 is 8-bits where either the left-most bit or the right-most bit is the least significant bit (LSB). In FIG. 5, the decimal point is used to visually distinguish data cell group 201 from the inversion status cell 202. It is assumed that all memory cells of data cell group 201 and inversion status cell 202 have a default unprogrammed logic state of "0" or erased logic state of "0". In this example, a defective cell 204 is detected in data cell group 201, marked with the letter "d".

According to the present embodiments, d can be permanently set to its biased logic state. For example, if defective cell 204 is a leaky OTP cell that tends to read out as a logic "1" while unprogrammed instead of the proper logic "0", then d is set to "1" by programming defective cell 204. Next, when 8-bit data is programmed to data cell group 201, the set logic "1" state of defective cell 204 is compared to the program data bit to be stored within it. If the program data bit mismatches the set logic state of defective cell 204, then all bits of the program data are inverted for programming into data cell group 201. Additionally, the default logic state of the inversion status bit is inverted and programmed into the inversion status cell 202. Otherwise, no inversion of the program data is required. Therefore, the defective cell 204 is reclaimed and the data cell group 201 is repaired as the defective cell 204 is re-used to store a data bit. It is noted that data to be stored in the cell group 200 of FIG. 5 includes the program data to be stored in the data cell group 201 and inversion status data to be stored in the inversion status cell 202. If there are no cell defects or no inversion is required, then the inversion status cell 202 remains in a default unprogrammed state, which corresponds to a logic "0" in the present examples.

Figure 6A:
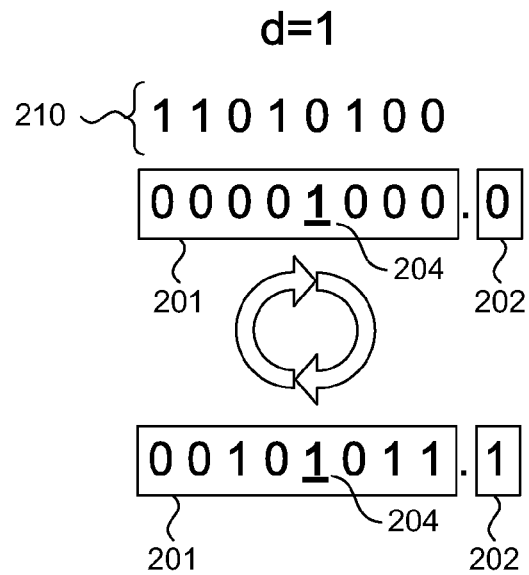
FIGS. 6A, 6B and 6C are drawings illustrating example redundancy operations, according to a present embodiment.
Figure 6B:
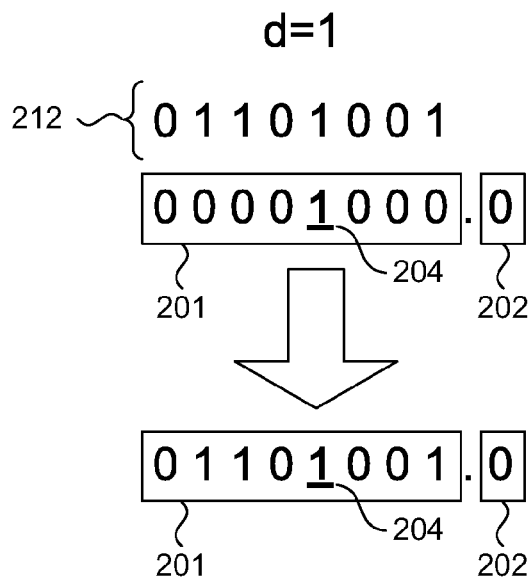
Figure 6C:
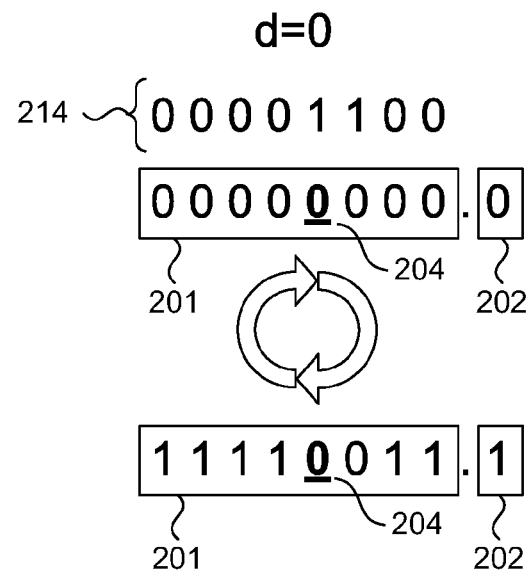

FIGS. 6A, 6B and 6C are examples illustrating the presently described redundancy technique, where the program data has a bit matching and mismatching the set logic state of the defective cell of a data cell group 201. In FIG. 6A, data cell group 201 of FIG. 5 has defective cell 204 permanently set to a "1" logic state (d=1), and program data 210 received by the memory device is to be stored in data cell group 201. Counting from the right side of data cell group 201, defective cell 204 is bit position 4 while bit position 4 of program data 210 is a logic "0". In order to reliably store program data 210 in data cell group 201, and due to the mismatch between bit position 4 of the data cell group 201 and bit position 4 of the program data 210, all bits of the data which includes program data 210 and the inversion status bit are inverted. The inversion process is illustrated by the circular arrows, and the resulting data stored by data cell group 201 is shown at the bottom of FIG. 6A. Because the data cell group 201 stores inverted program data, the inversion status cell 202 is programmed to a "1" logic state. This "true" logic state indicates that the data stored in data cell group 201 is inverted relative to its original version. The data stored in the inversion status cell 202 is referred to as an inversion status bit, which is used later during a read operation whereby the data is re-inverted back to its original state. Therefore, by storing an inverted version of the received program data in the data cell group 201, the defective cell 204 is reclaimed thereby allowing data cell group 201 to be used even though it has a detective cell 204.

FIG. 6B shows an example where different program data 212 is to be programmed to data cell group 201 shown in FIG. 6A. In this example, bit position 4 of the program data and bit position 4 of the data cell group 201 are both logic "1", and therefore match. No inversion of program data 212 is required, and the program data is directly stored in data cell group 201 as shown by the straight arrow. FIG. 6C shows an example where the defective cell 204 is set to a logic "0". It is assumed that the bit position 4 of data cell group 201 is known to have the defective cell set to logic "0". Since bit position 4 of program data 214 is a logic "1", there is a mismatch. Accordingly, all bits of program data 214 is inverted and stored in data cell group 201 while inversion status cell 202 is programmed to a logic "1" to indicate that the corresponding data cell group 201 stores inverted program data.

Figure 7:
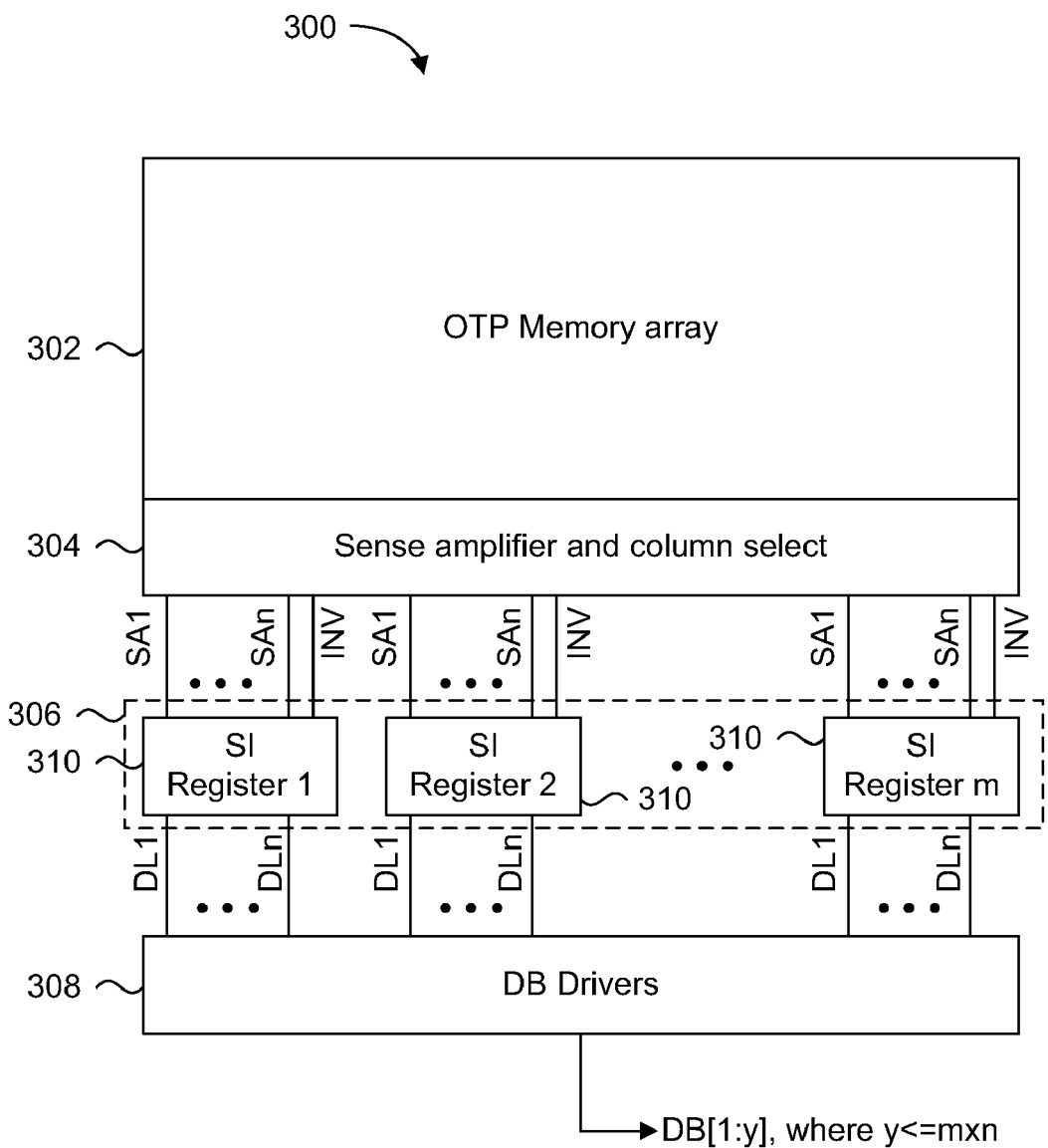
FIG. 7 is a block diagram of a memory having a redundancy system, according to a present embodiment.

Now that the redundancy concept of the present invention has been described, following is a description of a memory device or memory macro having the presently described redundancy scheme. Subsequent reference to a memory device should be understood to include a memory macro. A memory macro is an instance of the memory circuits which can be integrated into an embedded chip or system. FIG. 7 is a block diagram of a memory having a redundancy system, according to a present embodiment. The memory can be any non-volatile memory, but is now described within the context of an OTP memory. The memory device 300 includes an OTP memory array 302, sense amplifier and column select circuitry 304, a data register 306 and databus drivers 308. The data register 306 includes individual self-inverting (SI) data register 310. Each self-inverting data register 310 corresponds to one cell group, such as the n-bit +1 cell group 200 shown in FIGS. 5 and 6A, 6B and 6C.

Figure 1:
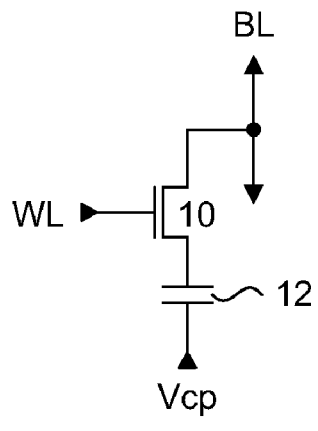
FIG. 1 is a circuit diagram of a DRAM-type anti-fuse cell.
Figure 2:
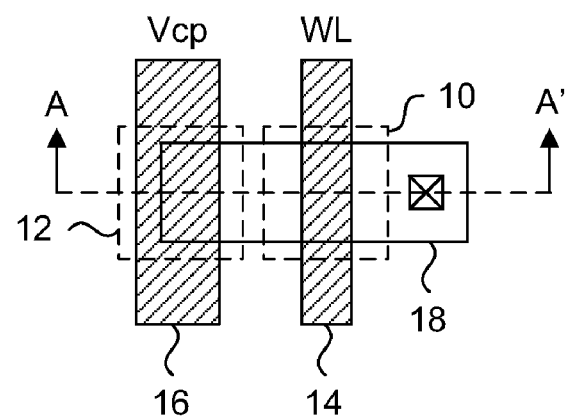
FIG. 2 is a planar layout of the DRAM-type anti-fuse cell of FIG. 1.
Figure 3:
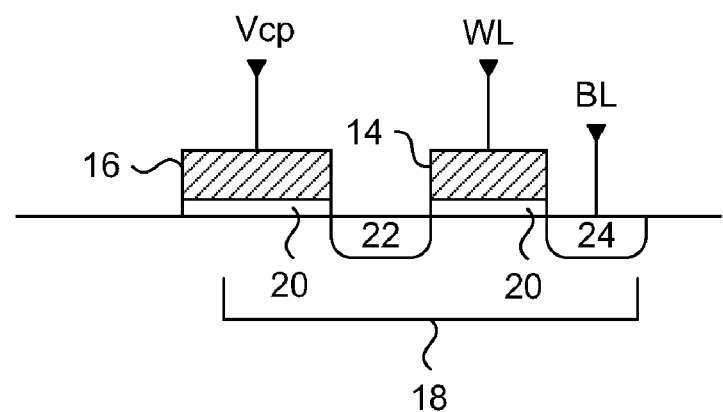
FIG. 3 is a cross-sectional view of the DRAM-type anti-fuse cell of FIG. 2 along line A-A'.
Figure 4A:
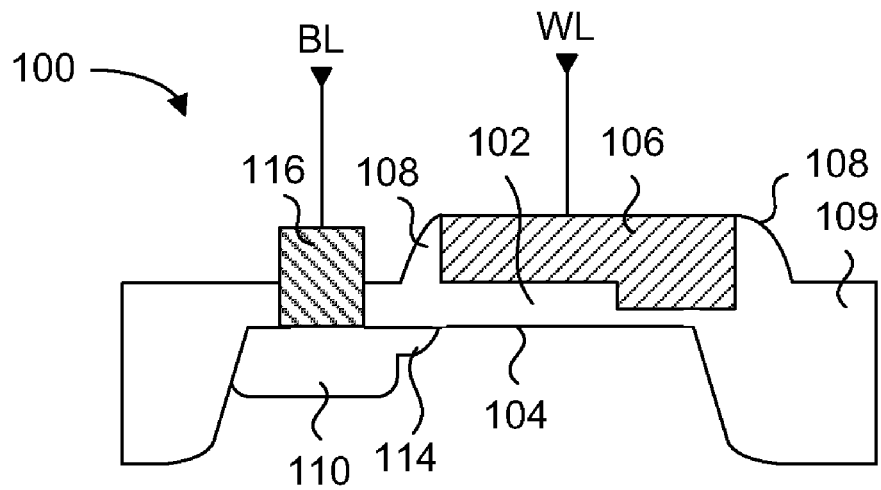
FIG. 4A is a cross-sectional view of the anti-fuse transistor of FIG. 4B, according to an embodiment of the present invention.
Figure 4B:
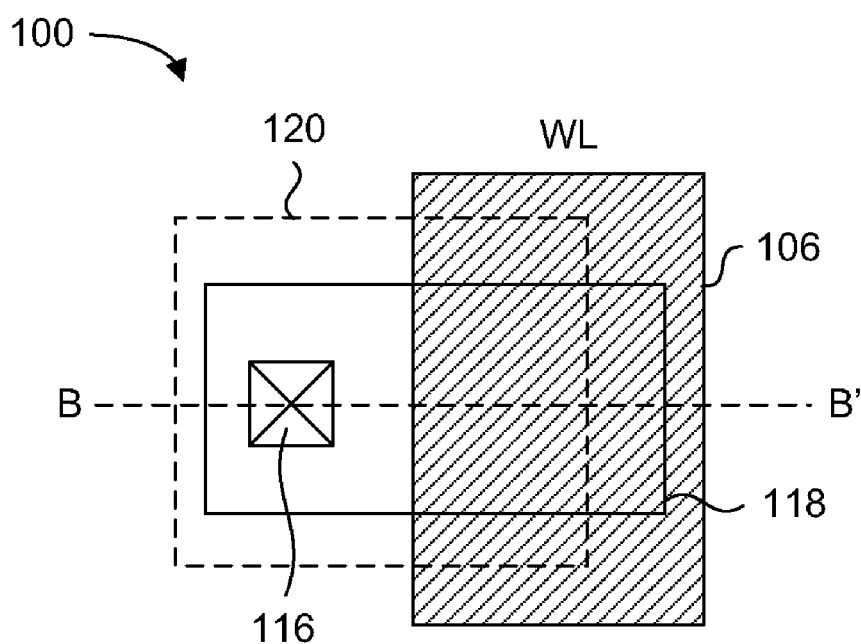
FIG. 4B is a planar layout of the anti-fuse transistor of FIG. 4A.

The OTP memory array 302 includes bitlines and wordlines connected to OTP memory cells, such as the OTP anti-fuse transistor device 100 shown in FIGS. 4A and 4B. The bitlines are sensed by sense amplifier circuits in sense amplifier and column select circuitry 304, which can include column select circuits for multiplexing one of a multiple of bitlines to one sense amplifier circuit, as is well known in the art. Each sense amplifier circuit of sense amplifier and column select circuitry 304 provides 1 bit of sensed read data for storage by latch circuits in SI data register 310. In the present example, each of the sense amplifier circuits also receives 1 bit of program data from latch circuits in SI data register 310. In FIG. 7, each sense amplifier circuit provides 1 bit of read data and receives 1 bit of program data via a pair of SA lines, where each pair is shown as single line SA. In the present example configuration, each SI data register 310 receives SA1 to SAn, where n corresponds to the size of the n-bit data cell group 201. There can be up to m SI data registers 310, where m is an integer value. Each SI data register 310 further receives and provides an inversion status bit INV. As previously mentioned, each SI data register 310 corresponds to an n-bit +1 cell group. As will be described in further detail later, each SI data register 310 can invert all the bits of its received program data in the event the aforementioned mismatch condition is detected for programming, and can re-invert all the read data bits in response to the inversion status bit INV in a read operation.

Each SI data register 310 receives program data from a write databus (not shown) and provides read data via datelines DL1 to DLn. It is noted that input and output datelines for 1 bit are represented by a single dateline. The databus drivers 308 perform a well known function of driving a databus DB[1:y], where y<=m×n. The width of DB depends on the configuration of memory device 300. Additional multiplexing circuitry can be included within the block of databus drivers 308 for coupling any set of datelines DL1 to DLn if the width of DB is less than m×n. According to the present embodiments, the inversion status bit INV is local to an SI data register 310 and the memory array, and is therefore not output in a manner similar to read data, nor is it received in a manner similar to program data.

Figure 8:
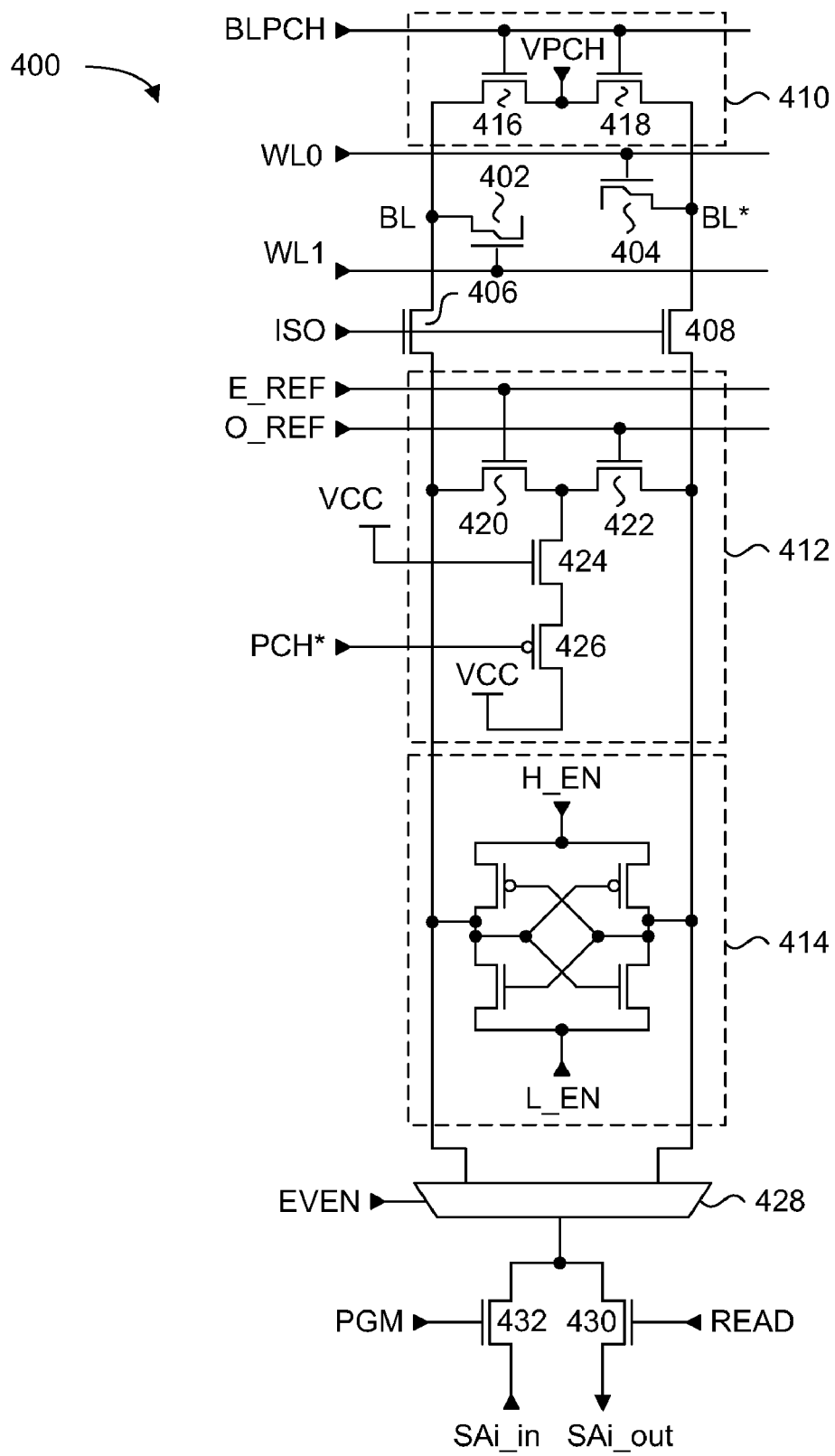
FIG. 8 is a circuit schematic of a portion of the memory array and circuits of the sense amplifier circuit block shown in FIG. 7.

FIG. 8 is a schematic of a portion of memory array 302 of FIG. 7 and its associated bitline sensing circuitry located in sense amplifier and column select circuitry block 304. In the present example, memory array 302 is organized in a folded bitline architecture, which is well known in the art. In order to simplify the schematic, only one folded bitline pair BL/BL* and two wordlines are shown. Column decoder circuitry is not shown for selectively coupling multiple folded bitline pairs to the bitline sense amplifier circuitry in order to simplify the schematic. Folded bitline memory array 400 includes wordlines WL0 and WL1 connected to the gate terminals of OTP memory cells, implemented in the present example as n-channel anti-fuse transistors 402 and 404, n-channel isolation transistors 406 and 408 for coupling the upper portion of the bitlines to the lower portion of the bitlines in response to signal ISO, and bitline sensing circuitry. The bitline sensing circuitry includes a precharge circuit 410, a reference charge circuit 412, and a bitline sense amplifier 414.

The precharge circuit 410 includes two n-channel precharge transistors 416 and 418 connected in series between BL and BL* and having their gate terminals connected to precharge signal BLPCH. The shared source/drain terminal of precharge transistors 416 and 418 receives a precharge voltage VPCH. In operation, both precharge transistors 416 and 418 will turn on to precharge bitlines BL and BL* to VPCH in response to an active high logic level of BLPCH, in preparation for a read operation.

The reference charge circuit 412 includes n-channel steering transistors 420 and 422 connected in series between BL and BL*, a capacitance circuit implemented as an n-channel transistor 424, and a p-channel precharge transistor 426. Steering transistor 420 has its gate terminal connected to even selection signal E_REF, while steering transistor 422 has its gate terminal connected to odd selection signal O_REF. Capacitance circuit 424 has its gate terminal connected to voltage supply VCC, and is connected in series with precharge transistor 426 between the shared source/drain terminal of steering transistors 420 and 422 and voltage supply VCC. Precharge transistor 426 has its gate terminal connected to a precharge or enable signal PCH*. Generally, capacitance circuit 424 will be precharged when a low logic level PCH* pulse is received. The duration of the PCH* pulse can be predetermined based on the size of transistor 424 and the desired reference charge to be provided. Once precharged, either steering transistor 420 or 422 is turned on to couple the reference charge of capacitance circuit 424 to the corresponding bitline. By example, the charge being added to a bitline can be approximately 50 millivolts. It is noted that signals E_REF and O_REF can be controlled by the same even/odd addressing bit used for selecting WL0 or WL1. In one embodiment, activation of WL0 will cause E_REF to be activated, thereby coupling the reference charge to the complementary bitline.

The bitline sense amplifier 414 consists of a standard cross-coupled inverter circuit which is well known in the art. The circuit includes p-channel transistors both connected in series to respective n-channel transistors. The common drain terminal of the p-channel transistors receives a high logic level enable signal H_EN, while the common source terminal of the n-channel transistors receives a low logic level enable signal L_EN. H_EN can be a lowered internal VCC level, while L_EN can be a VSS level. The operation of bitline sense amplifier 414 in the DRAM art is well known. When enable signals H_EN and L_EN are activated, either at the same time or at different times, bitline sense amplifier 414 will sense a small voltage differential between BL and BL*, and quickly drive both BL and BL* to the full logic level states of H_EN and L_EN.

Because bitline sense amplifier 414 is connected to both bitlines BL and BL*, the logic state being programmed or read from the memory array will depend on the memory cell that is accessed. For example, if both anti-fuse transistors 402 and 404 store a logic "1", bitline sense amplifier 414 will latch two different logic states depending on which anti-fuse transistor is accessed. Therefore, a data state corrector 428 is used for ensuring that the voltage level corresponding to logic "1" and "0" states is read and programmed. In the present example, if WL0 is activated to read anti-fuse transistor 404, then signal EVEN will be at the logic state for coupling BL* to gating transistor 430. Alternately, of WL1 is activated to read anti-fuse transistor 402, then signal EVEN will be at the opposite logic state for coupling BL to gating transistor 430. The operation of data state corrector 428 is similar when program data is to be coupled to either BL or BL* from gating transistor 432. Data state corrector 428 can be implemented as a simple bi-directional multiplexor controlled by signal EVEN, which can be related to the address used to select wordline WL0 and WL1. Signal EVEN can be related to signals E_REF and O_REF as well. Data to be programmed to the bitlines is provided through n-channel gating transistor 432 which is coupled to SAi_in and controlled by program signal PGM. Data to be read from the bitlines is provided through n-channel gating transistor 430 which is coupled to SAi_out and controlled by read signal READ. It is noted that signals SAi_in and SAi_out correspond to the previously discussed pair of SA lines. Accordingly, gating transistor 432 is turned on during a program operation while gating transistor 430 is turned on during a read operation. Variable "i" is an integer value between 1 and max number n.

The memory array architecture and circuits of FIG. 8 is one example of a non-volatile memory array configuration which can be used in the embodiments of the present invention, and the presently described redundancy scheme is not limited to the memory array configuration of FIG. 8. The memory array architecture of FIG. 8, and in particular the configuration whereby separate sense amplifier input and output paths SAi_in and SAi_out, facilitates the design and operation of the self-inverting register circuits.

Figure 9:
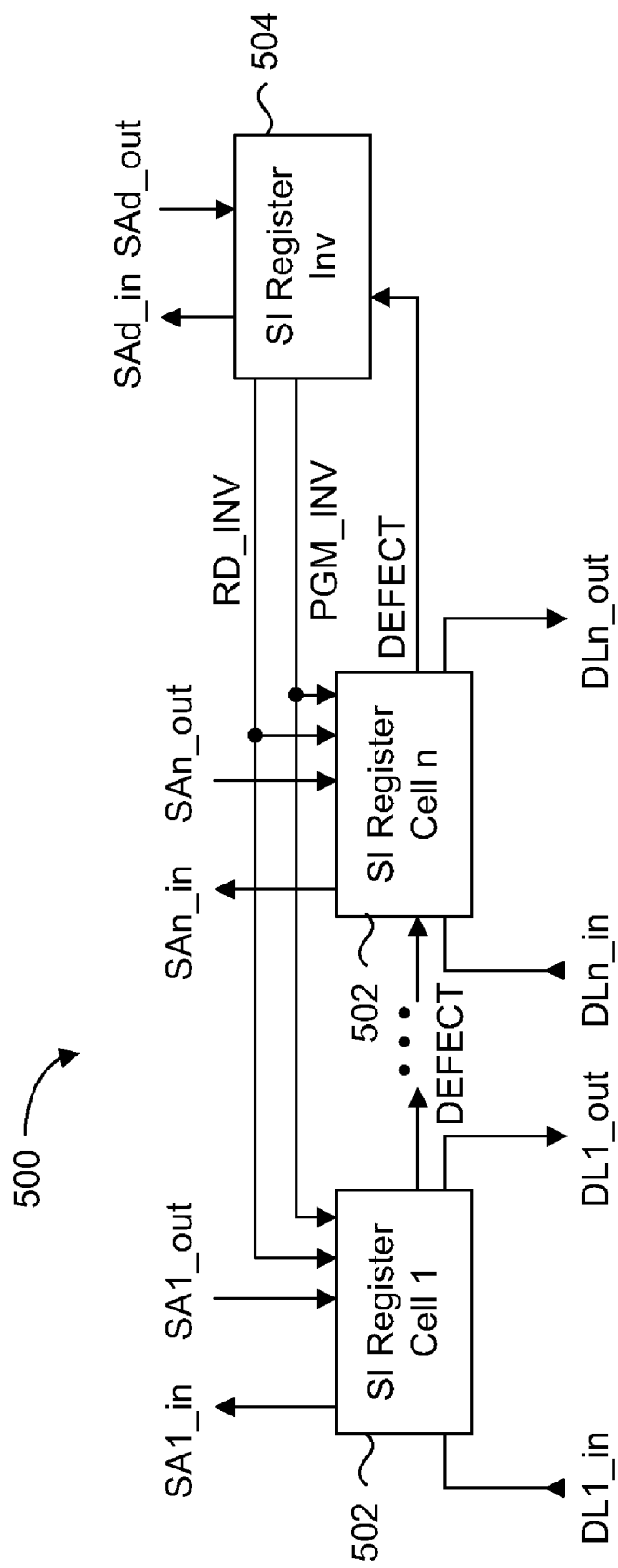
FIG. 9 is a circuit schematic of an n-bit self-inverting data register of FIG. 7, according to a present embodiment.

FIG. 9 is a block diagram showing one SI data register 310 of FIG. 7 according to a present embodiment. SI data register 500 includes one SI register cell 502 for each bit of data to be programmed or read out from memory array 302, and an SI register cell 504 for the inversion status bit. The SI register cells 502 are labeled Cell 1 to Cell n, to correspond to the n-bit data cell group 201. As shown in FIG. 9, each SI register cell 502 provides 1 bit of program data via an SAi_in line to a sense amplifier and receives 1 bit of read data via an SAi_out line (where i=1 to n) from the sense amplifier. The 1 bit of program data is provided by a DLi_in line, while the 1 bit of read data is output from the register cell by a DLi_out line.

As part of a program operation, each SI register cell 502 is configured to compare the logic state of its received program data bit against the logic state of the cell it is to be programmed to. In the previously discussed example, a cell set to a logic "1" is a leaky defective cell. In the case of a mismatch, a mismatch flag DEFECT is provided and cascaded through the SI register cells. In otherwords, each SI register cell 502 logically OR's its mismatch flag result to that provided by a previous SI register cell 502. The final DEFECT flag indicates if one of the SI register cells 502 reported a mismatch, and is received by SI register cell 504 which checks to see if the inversion status cell is defective or not. If one SI register cell 502 reports a mismatch or SI register cell 504 reports that the inversion status cell is defective, then a program inversion signal PGM_INV provided by SI register cell 504 is set to an active logic level. All SI register cells 502 receive PGM_INV, and are configured to invert their program data bits in response to the active logic level of PGM_INV. Then the inverted program data is programmed into the corresponding cells of the data cell group. In the present example, the inverted program data is provided to the sense amplifier circuit via respective SAi_in lines. Also, the inversion status bit is set and the corresponding inversion status cell is programmed to indicate that the program data has been inverted.

In a read operation, the all SI register cells 502 receive read data from its respective SAi_out line, and SI register cell 504 receives the logic state of the inversion status bit read from the corresponding inversion status cell. If the inversion status bit is at a logic level indicating that the program data has been inverted, then read inversion signal RD_INV is set to an active logic level. All SI register cells 502 receive RD_INV, and are configured to invert their read data bits in response to the active logic level of RD_INV. Therefore the original program data is restored and output to the databus drivers. Accordingly, the SI register cells 502 and 504 can invert either the program data bits or read data bits within the register cell itself.

Figure 10:
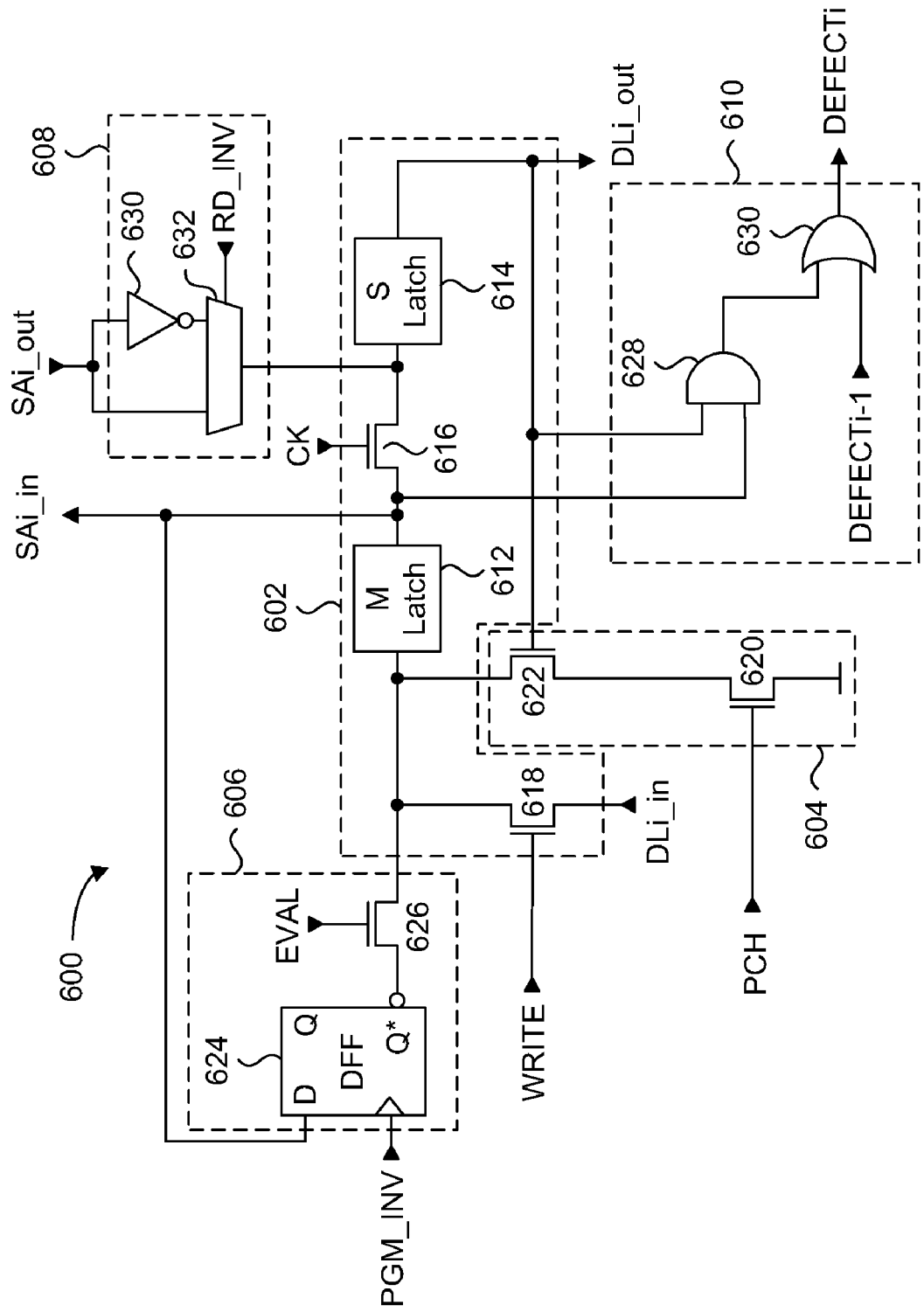
FIG. 10 is a circuit schematic of a single bit self-inverting register cell of the n-bit self-inverting data register of FIG. 7, according to a present embodiment.

FIG. 10 is a circuit schematic of the SI register cell 502 shown in FIG. 9, according to a present embodiment. It is noted that SI register cell 600 includes many of the same circuits as the dual function shift register circuit disclosed in PAT 3672W-90. In order to simplify the schematic several circuits are intentionally omitted.

SI register cell 600 includes a data storage circuit 602, an auto-program inhibit circuit 604, a program data inversion circuit 606, a read data inversion circuit 608 and data mismatch comparison logic 610. It is recalled that variable "i" in the signal names denotes the specific register cell it is associated with.

Data storage circuit 602 is responsible for data input, output and latching operations. Data storage circuit 602 includes a master latch 612 and a slave latch 614 connected as a master-slave flip-flop, transfer gating device 616, and an input gating device 618. Latches 612 and 614 can be implemented as simple cross-coupled inverter circuits with a non-inverting output relative to its input, but slave latch 614 is configured to be overwritten by master latch 612. Those skilled in the art will understand that transistor sizing can be configured to achieve this desired function. Gating device 616 is shown as an n-channel transistor, but can be replaced with a transmission gate or a p-channel transistor. Gating device 616 has its gate terminal connected to clock signal CK, which is a controlled clock signal to shift data serially from the master latch 612 to slave latch 614. Input data DLi_in is provided to the input of master latch 612 via gating device 618 when signal WRITE is at the active logic level, which in the present example is the high logic level. Output data DLi_out is provided from the output of slave latch 614. The output of master latch 612, typically being program data, is coupled to a sense amplifier via terminal SAi_in, while read data from the sense amplifier is provided from terminal SAi_out and stored by slave latch 614.

The auto-program inhibit circuit 604 is used to verify if a programming operation was successful or not. The auto-program inhibit circuit 604 includes a precharge device 620 and a coupling device 622 connected in series between a voltage supply such as VDD and the input of master latch 612. Both devices 620 and 622 are shown as being n-channel transistors in the present embodiment. The gate of precharge device 620 is connected to precharge signal PCH and the gate of coupling device 622 is connected to the output of slave latch 614. The selection of the voltage supply depends on the logic state stored by master latch 612 for selecting a memory cell to be programmed. For example, if master latch 612 stores a logic 0 (VSS) to indicate programming of the memory cell connected to that bitline, then the voltage supply connected to precharge device 620 will be VDD. Hence, VDD is the logic state stored in a master latch 612 for a memory cell that is not to be programmed, thereby inhibiting programming of the cell connected to that bitline. The auto-program inhibit circuit will therefore change the state of the master latch 612 if the memory cell was successfully programmed. In the present example, a successfully programmed memory cell will result in slave latch 614 storing a high a logic state in a program verify read operation following a program operation. Therefore, when PCH is driven to the high logic level, VDD is coupled to the input of master latch 612 to flip its state.

The program data inversion circuit 606 includes a flip-flop circuit 624 and a coupling device 626 controlled by an evaluation signal EVAL. Flip-flop circuit 624 has a D-input receiving program data latched by master latch 612 (SAi_in), and has a non-inverting output (Q) and an inverting output (Q*), where the inverting output is connected to one terminal of the coupling device 626. The other terminal of the coupling device 626 is connected to an input of master latch 612, while its gate terminal receives EVAL. Flip-flop circuit 624 latches the data appearing on its D-input and provides the inverted version thereof on its inverting output Q* in response to an active logic state of PGM_INV received at its clock input. Therefore, if the program data is to be inverted, PGM_INV is driven to the active logic level and EVAL can be pulsed to briefly turn on coupling device 626 to electrically connect the inverting output Q* to the input of master latch 612. Therefore the logic state of master latch 612 is inverted. The pulse duration of EVAL can be selected to be at least long enough to ensure that master latch 612 is over-written or flipped.

The data mismatch comparison logic 610 is used in conjunction with program data inversion circuit 606, and includes an AND logic gate 628 and an OR logic gate 630. AND logic gate 628 has a first input receiving an output of slave latch 614 and a second input receiving an output of master latch 612. The purpose of AND logic gate 628 is to detect the condition where a logic "0" is to be programmed to a defective cell set to permanent store a logic "1". As previously discussed for the present example, a logic "1" stored in master latch 612 inhibits programming, thereby storing a logic "0" in the selected cell. However, if the selected cell has been previously determined to be defective and preset to store a logic "1", then there is a mismatch between the data to be stored and the preset logic state of the cell. This mismatch condition is detected by AND logic gate 628 when both master latch 612 and slave latch 614 store a logic "1". Therefore AND logic gate 628 outputs a logic "1" output, which can be referred to as a local DEFECT flag signal, which is then combined with a global DEFECT flag signal DEFECTi-1 provided from a previous SI register cell 502 at OR logic gate 630. The output of OR logic gate 630 is the updated global flag signal DEFECTi that is provided to the next SI register cell 502, or the SI register cell 504. If SI register cell 600 is the first register cell, then its OR logic gate 630 has one input tied to ground or VSS as there is no previous SI register cell to report a defect. Later, if DEFECTi is at the active logic level, which in the present example is a logic "1", then PGM_INV is set to the active logic level to enable inversion of the program data.

The read data inversion circuit 608 is connected between SAi_out and the input of slave latch 614, and includes a selector 632 and an inverter 634. Selector 632 is shown as a multiplexor having a first input for receiving SAi_out and a second input for receiving an output of inverter 634, where inverter 634 has its input connected to SAi_out. Selector 632 passes data from either its first input or second input, to its output in response to signal RD_INV, which functions as a selection signal. In its default inactive logic state, RD_INV control selector 632 to pass SAi_out directly to slave latch 614. In its active logic state, where the read data is to be inverted, selector 632 passes the output of inverter 634 to slave latch 614. Therefore an inverted version of SAi_out is stored in slave latch 614.

Figure 11:
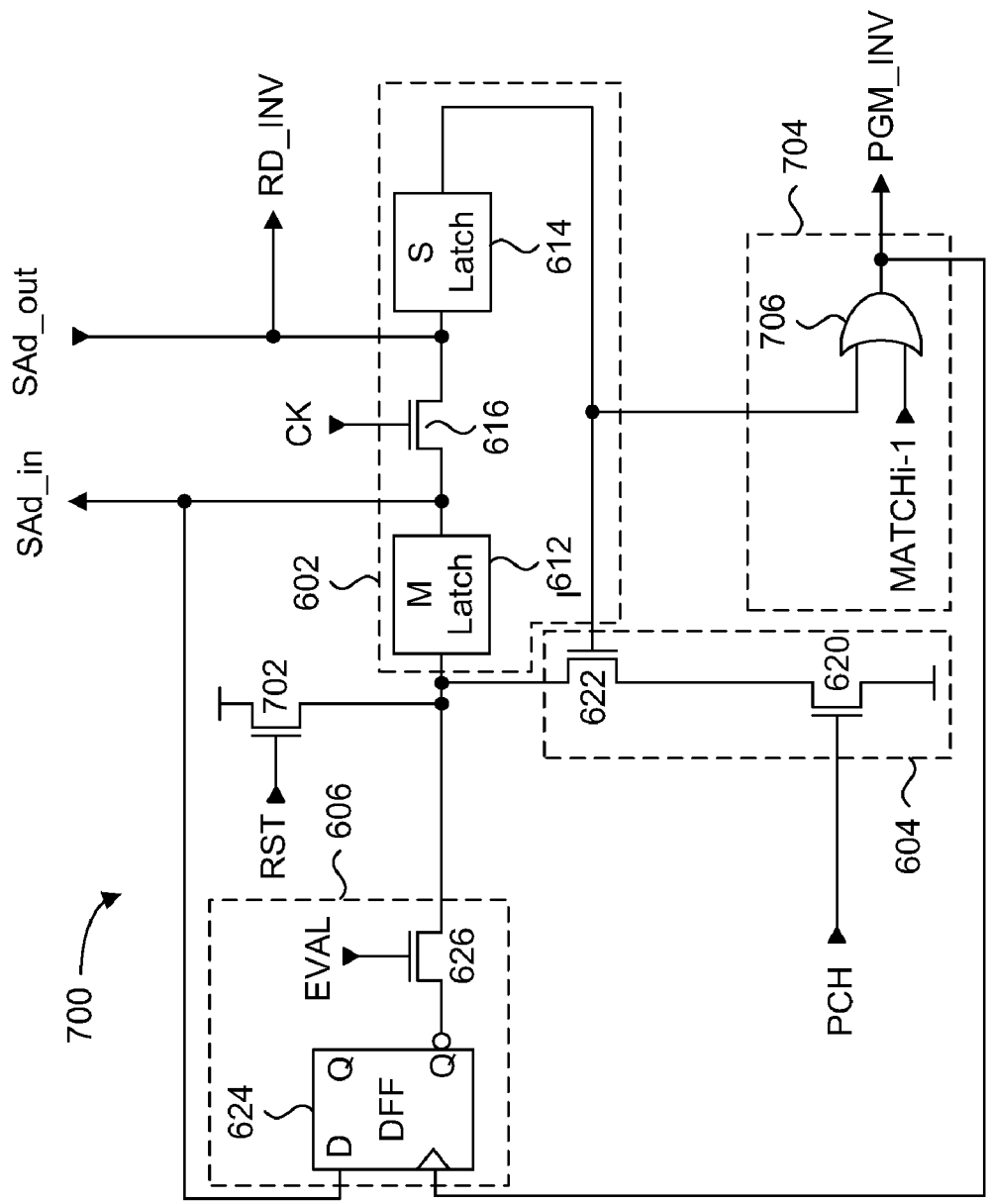
FIG. 11 is a circuit schematic of the inversion status bit register, according to a present embodiment.

FIG. 11 is a circuit schematic of the SI register cell 504 of FIG. 9, according to a present embodiment. SI register cell 700 includes many of the same circuits as shown for SI register cell 600 of FIG. 10. In particular, circuits 602, 604 and 606 are the same as those previously described for SI register cell 600. SI register cell 700 does not have input gating device 618 for receiving program data, an output terminal at the output of slave latch 614 for providing read data, read data inversion circuit 608, or data mismatch comparison logic 610. SI register cell 700 is coupled to bitlines of the memory array and sense amplifier circuits which can be configured identically to the circuit of FIG. 8.

Following is a description of the circuits that differ from SI register cell 600 of FIG. 10. Instead of having an input for receiving program data, SI register cell 700 includes a reset circuit consisting of a transistor device 702 for coupling VDD to the input of master latch 612 in response to a reset signal RST. Reset signal RST can be a pulsed signal provided prior each programming operation to set a default program inhibit state for the inversion status cell. SI register cell 700 does not require read data inversion, as the inversion status bit is not provided externally to the memory device. The SAi_out line can be used as the RD_INV signal, or alternately, the output of slave latch 614 can provide the RD_INV signal. As previously described, the inversion status bit being permanently set to or programmed to a logic "1" indicates that the original program data stored in the data cell group 201 has been inverted due to the presence of a defective bit in the data cell group 201 or the presence of a defective inversion status cell.

Instead of data mismatch comparison logic 610, defect detection logic 704 combines the global flag DEFECTi-1 from the last SI register cell 502 with an output of slave latch 614. Accordingly, if either DEFECTi-1 or the output of slave latch 614 is at the logic "1" state, then PGM_INV is set to the active logic "1" state. In the present example, if slave latch 614 is at the "1" logic state, it means that the corresponding cell was previously determined to be defective, and pre-programmed to a specific logic state. The reclamation of a defective inversion status cell is the same as for a normal data storing cell. In the present embodiment, defect detection logic 704 includes an OR logic gate 706. In the previously described embodiments, those skilled in the art should understand that alternate logic gates or circuits can be used to achieve the same desired result, since programmed and unprogrammed logic states may be reversed relative to those discussed for the present embodiments.

Now that example circuits have been described for implementing the redundancy scheme of the present embodiments, following are method embodiments describing sequences for operating the described memory device and circuits with redundancy.

Figure 12:
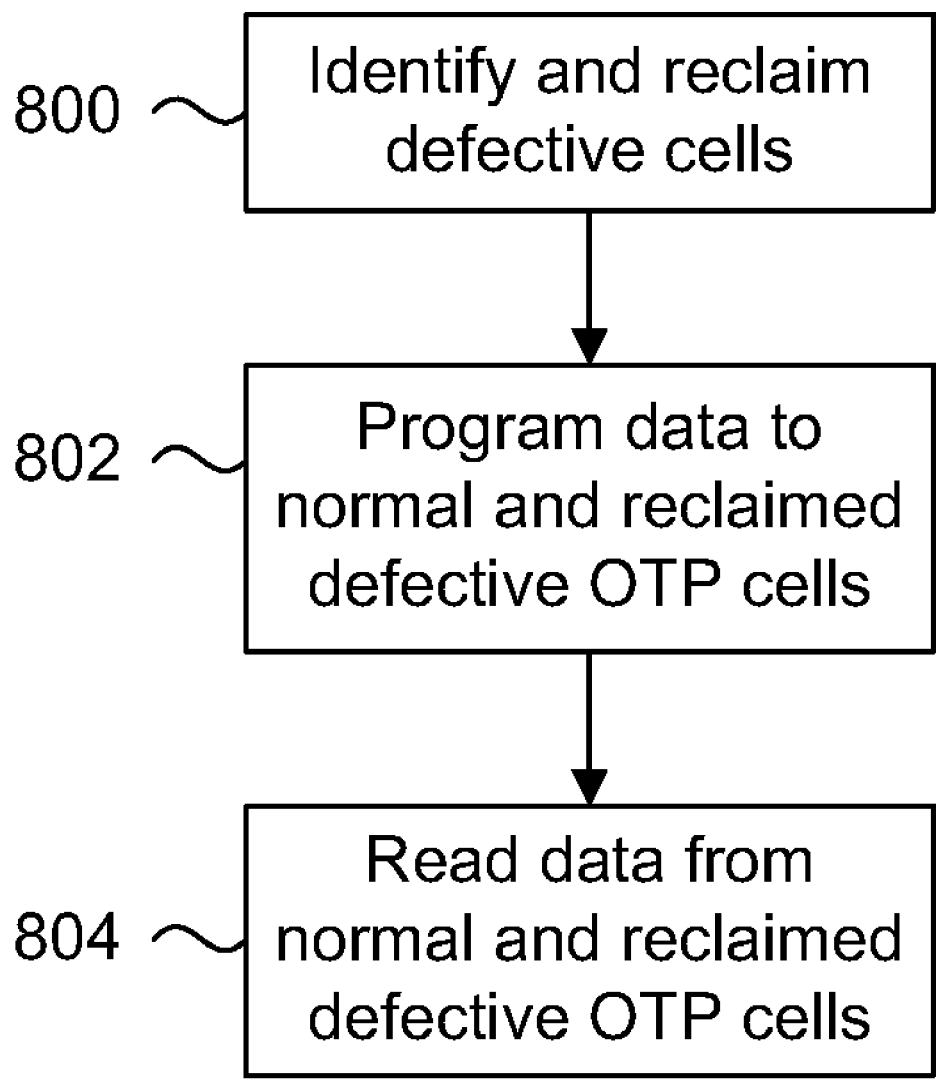
FIG. 12 is a flow chart of a general method for operating an OTP memory having a redundancy scheme, according to a present embodiment.

FIG. 12 is a flow chart of a general method for operating a memory device having a redundancy scheme, according to the present embodiments. The method starts at 800 where defective cells are identified and reclaimed. This step includes identification of leaky cells at manufacturing and before end user programming, and by example, reclamation of leaky cells behaving as a programmed cell includes pre-programming them to a permanent logic "1". Redundancy has been implemented after step 800, such that previously unusable cells are prepared for storing user data.

At step 802, the end user which can also be the manufacturer, programs data to the memory array. Cell groups, such as cell group 200, without any defective cells are programmed without inversion of the program data bits and the inversion status bit. Cell groupings with a defective cell, such as a pre-programmed "1" cell from step 800 may be inverted depending if the data bit position matches or mismatches the pre-programmed "1" of the corresponding defective cell.

At step 804 a read operation is executed to read data from the memory array. If the data is read from a cell group having a defective cell, then the read data is inverted into its original program data state for output. Otherwise, the read data is output without inversion. Therefore, even though program data may be stored in its inverted state, the resulting read data will always correspond to the original program data provided to the memory device.

Figure 13A:
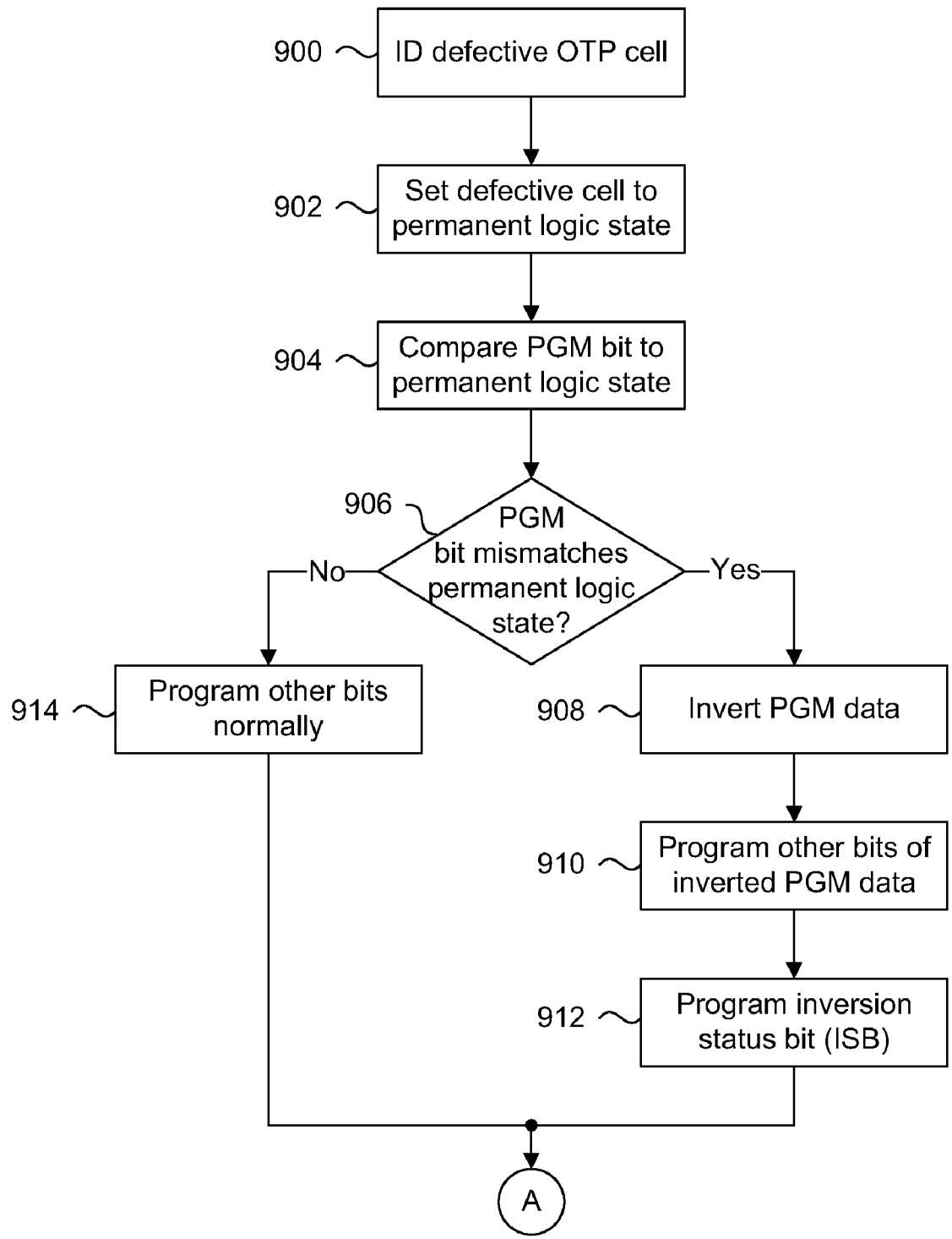
FIGS. 13A and 13B is an embodiment of the method shown in FIG. 12, according to a present embodiment.
Figure 13B:
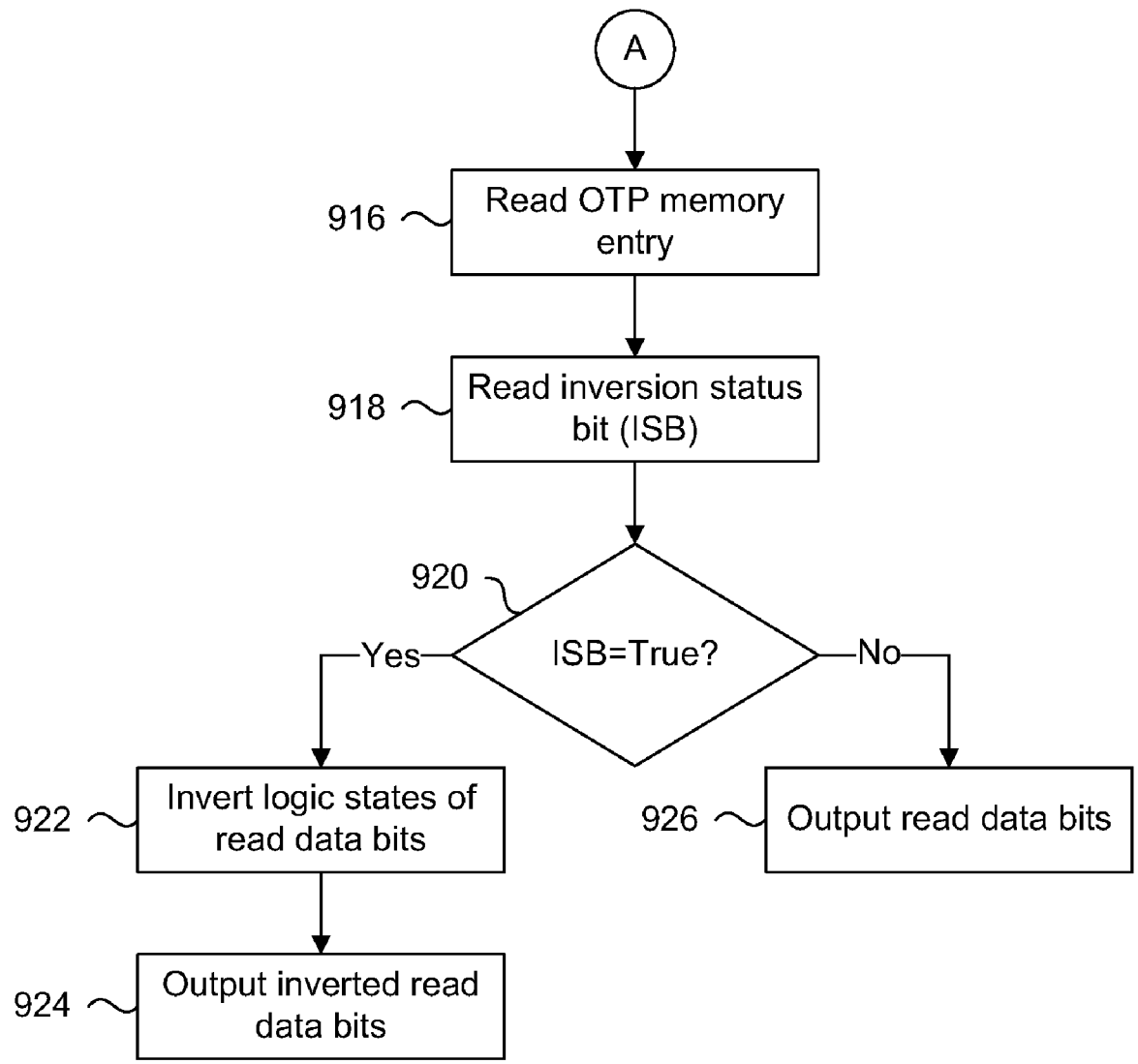

FIGS. 13A and 13B show a particular embodiment of the method shown in FIG. 12. In the present method, it is assumed that the memory cells are OTP memory cells such as those described in the present application. Therefore reference is made to the circuit schematics of FIGS. 10 and 11, which are configured for these OTP memory cells. The method starts at step 900 where defective cells are identified using any suitable test technique. For example a read operation performed on all the unprogrammed cells can help determine if any are "leaky". Since such leaky cells tend to behave as programmed cells, the detected defective cells are programmed to store a permanent logic "1" at step 902. This can be done by entering program data into the data register 306 of FIG. 7, as would be done for a normal programming operation. However, this pre-programming of defective cells would typically be performed before shipping to end users for normal use and operation.

Steps 900 and 902 would be executed in step 800 of FIG. 12. It is assumed that the memory device is ready for normal operation. Program data for a data cell group is provided to the SI register cells 502 of FIG. 9 via the DL1_in to DLn_in lines, and is thus stored in the master latch 612. At step 904, a read operation is executed for the cells to which the program data is intended to be programmed into. This data is stored in the slave latch 614 of FIG. 10, and each SI register cell 502 compares its slave latch data to its corresponding program data bit stored in master latch 612 using data mismatch comparison logic 610.

At step 906, assuming that one cell is defective (logic "1"), and the corresponding master latch 612 stores a logic "1", a mismatch is detected between the permanent logic state of the inversion status cell and the program data bit. In this case, the method proceeds to step 908 where all the program data bits are inverted. This is done by SI register cell 504 which asserts the PGM_INV signal. In response to PGM_INV, all SI register cells 502 of the data cell group clock their respective flip-flops 624. At about the same time, SI register cell 504 also clocks its respective flip-flop 624 in response to PGM_INV. Signal EVAL can then be pulsed to flip the logic state of master latches 612. Hence the program data of SI register cells 502, and the reset logic "1" state stored by master latch 612 of SI register cell 504 is flipped to a logic "0". As part of step 908, and after the EVAL signal has been pulsed, the PCH signal can be pulsed. This will re-invert the master latch 612 of the SI register cell 502 from the inverted logic "0" back to a logic "1" since coupling device 622 is presently turned on by the "1" logic state of the slave latch corresponding to the defective cell. Since the defective cell is already programmed, there is no need to reprogram it again. At steps 910 and 912, the cells are programmed according to the data stored in the mater latches 612 of SI register cells 502 and 504.

Returning to step 906, if there is no mismatch between any of the data bits and the defective cell, or there is no defective cell in the cell group, then the data is programmed at step 914 without any program data inversion. Also, the inversion status bit remains unprogrammed. Steps 904, 908 to 912 or 914 are repeatedly executed for program operations. After programming, a read operation can be executed, which starts in FIG. 13B.

At step 916, it is assumed that the bitlines have been precharged and a wordline has been asserted for reading data from at least one cell group. The bitlines are sensed by bitline sense amplifier circuitry, and sensed bitline data is output. In the present embodiments, this sensed bitline data is provided to SI register cell 600 via the SAi_out line. Because the inversion status cell is connected to the same wordline as the cells of the present data cell group, the inversion status bit is read at substantially the same time at step 918. In SI register cell 700, the sensed inversion status bit is provided by the SAd_out line. If at step 920 the inversion status bit (ISB) is true, ie. a logic "1" for example, indicating that the data of the data cell group has been inverted relative to the original program data, then the method proceeds to step 922. At step 922, RD_INV is at the active logic level to control selector 632 of each SI register cell 600 to pass the output of inverter 630. Now the slave latches 614 store the original received program data (inverted read data), which can then be output from the memory device via DLi_out at step 924. Returning to step 920, if the inversion status bit is false, ie. a logic "0" for example, then the selectors 632 of each SI register cell 600 couple SAi_out directly to slave latches 614. The read data is then output via the DL_out lines in their uninverted form at step 926.

FIG. 14 is a table showing example memory array cell groups 200, program data to be stored in each data cell group 201, and the final stored values in the respective cell groups 200 when the cell groups do not have a defective cell or have one defective cell. Starting from the left-most column in FIG. 14, different program data are shown in each row. The second column shows rows of data cell groups 201 and their corresponding inversion status cell 202 after testing. Each row of program data is intended to be stored in a corresponding row of a data cell group. The testing shows that cells marked with an "x" are defective. It is noted that a status inversion cell 202 can be defective. In the present example, it is assumed that the test identifies leaky cells. The third column shows the status of the cell groups 200 of the same row after the defective leaky cells are programmed to a logic "1" state. The fourth column shows the final state of the programmed data of the row, stored in the cell group.

Figure 15:
FIG. 15 is an alternate example showing the presently described redundancy technique applied to a memory array.

In FIG. 14, one inversion status cell 202 is used for each n-bit data cell group 201. FIG. 15 is a table showing an alternate configuration where two inversion status cells can be used for respective segments of an n-bit data cell group of the cell group 200. FIG. 15 is a table similar to the one shown in FIG. 14, except that now each row of program data consists of two segments, each being 8-bits in length. The corresponding data cell group 201 of the row in the adjacent column is visually divided into two 8-bit segments, and has two inversion status cells 202a and 202b. In the present example, inversion status cell 202a is associated with the left-most 8-bits of the data cell group 201, while inversion status cell 202b is associated with the right-most 8-bits of the data cell group 201. Accordingly, each segment can store inverted program data independently of the other.

The addition of further inversion status cells enables the correction of multiple cells. For example, in a row with 32 bits, each 8 bits of the 32 bits can be assigned one inversion status cell to correct one defective cell per 8 bits, thus correcting up to 4 defective cells per row. The distribution of the data segments in an entry can also be varied to optimize the method. For example the data segment can be contiguous, or distributed. For example one inversion status bit can be assigned for even data bits and another for odd data bits. The distribution of the data segments affects the distribution of the defective cells that can be corrected. For example for an NVM of 32 bits with 2 redundancy bits (one redundancy bit per 16 data bits). If the data segments are contiguous, one defective cell can be corrected in the first or second 16-bit segments. If the data segments are on even and odd rows, one defective cell in even or odd bits can be corrected.

The previously described embodiments show a redundancy technique to reclaim and reuse a defective, leaky cell. The presently described redundancy technique can be applied to reclaim and reuse a defective, weak cell. In contrast to the presently described leaky cell, a weak cell is one that is logically biased to a logic "0" as it has been found difficult to program. The principles of the present redundancy scheme applies to such cells when they have been detected in a cell group 200. The following method can be a modified version of steps 906, 908, 910 and 912 of FIG. 13A. It is first assumed that the programming operation of the memory device is reversible. Since multiple bits are to be programmed at the same time, it is possible that while one cell of the cell group 200 programs its logic "1" state, another cell cannot program its logic "1" state. Using logic circuits in the dual shift register of PAT 3672W-90, a program fail condition can be detected where the cell cannot be programmed after a number of preset programming iterations have been attempted. Because the auto-program inhibit circuit 604 of the SI register cell 600 can be used to flip the logic state stored in master latch 612 after the corresponding cell has been properly programmed, the only master latch 612 of the cell group 200 which has not successfully programmed after the preset programming iterations will have a logic "0" stored therein. Cells for which no programming was intended will have a logic "1" stored in the corresponding master latch 612.

Since it is now known that a cell cannot be programmed (therefore weak), a program bit thus mismatches the permanent state of the failed cell, which corresponds to step 906 of FIG. 13A. In modified step 908, the programming of the cell group 200 is reversed to their default states and new program data being an inversion of the original program data is loaded into the SI register cells 600. At modified step 910 the inverted data is programmed and at modified step 912 the inversion status bit is programmed to indicate the presence of inverted program data in the corresponding data cell group. Therefore, the cell which failed to program a logic "1" now stores a logic "0".

Alternately, data having a bit position matching the biased logic state of the weak cell can be found for programming to the cell group 200 without any inversion after the failed programming condition is identified. In this process, the data stored in the master latches 612 are shifted to the slave latches 614, and output on the DLi_out lines to identify the bit position where programming failed. Once the bit position of the failed programming operation is identified, any programming of the cell group 200 is reversed and suitable program data is loaded into the SI register cells 502 for programming. Accordingly, while leaky cells are identified during testing prior to use, weak cells are identified during an in-use programming operation.

FIG. 16 is a table illustrating the presently described redundancy technique for reclaiming both weak cells and leaky cells, according to a present embodiment. Starting from the left-most side of the table, the first column lists rows of different program data. The second column lists corresponding cell groups 200 having detected leaky cells marked with an "x". The third column lists the same cell groups 200 shown in rows of the second column, but having weak cells detected during a programming operation. The weak cells are marked with a "y". The fourth column shows the final programmed data in the cell groups 200, where some program data is inverted if the data bit mismatches the preset permanent logic state of the corresponding cell in the cell group 200. For those data cell groups 201 which store inverted program data, its corresponding inversion status cell 202 is programmed.

Looking at the program data bits from left to right, if the first bit position from the left is to be programmed to a logic "1", which corresponds to the bit position in the entry marked with a "y". As shown in right-most column, the entries are inverted when the data values starting with a "1" match the "y" position entry. Therefore when inverted, the "y" bit stores a logic "0", and the redundancy bit is programmed to the logic "1" state to indicate the inverted status of the stored data. It is noted that the same inversion status bit can be used for both types of errors.

The embodiments of the present invention can be used with any programmable non-volatile memory, where defective cells exhibit biased logic states. The previously described embodiments of the self-inverting data register 310 is one means for performing defective cell detection, program data inversion and read data inversion. Alternate techniques and circuits can be developed for obtaining the same desired result.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A non-volatile memory comprising:
   n cells for storing an n-bit entry where a defective cell of the n cells is settable to a permanent logic state, where n is an integer value of at least 1;
   an inversion status cell programmable from a default first logic state to a second logic state when the n cells store program data inverted relative to input data received by the non-volatile memory; and
   a data register for inverting the input data into the program data in response to a mismatch between the permanent logic state of the defective cell and a logic state of a bit of the input data to be programmed to the defective cell, and for inverting read data from the n cells when the inversion status cell stores the second logic state, the data register including:
   n register cells corresponding to each of the n cells for storing a bit of the input data and a bit of the read data, each of the n register cells inverting the bit of the input data in response to a program inversion signal and inverting the bit of the read data in response to a read inversion signal; and
   an inversion register cell corresponding to the inversion status cell for providing the program inversion signal in response to the mismatch between the permanent logic state of the defective cell and a logic state of a bit of the input data to be programmed to the defective cell.

2. The non-volatile memory of claim 1, wherein each of the n register cells includes a first latch circuit for storing the bit of the input data, and a second latch circuit for storing the bit of the read data.

3. The non-volatile memory of claim 2, wherein each of the n register cells includes
   a program data inversion circuit for inverting the bit of the input data in response to the program inversion signal.

4. The non-volatile memory of claim 2, wherein each of the n register cells includes
   a read data inversion circuit for inverting the bit of the read data in response to the read inversion signal.

5. The non-volatile memory of claim 2, wherein each of the n register cells includes
   data mismatch comparison logic for comparing the bit of the input data to the bit of the read data to provide a defect signal indicative of the mismatch.

6. The non-volatile memory of claim 1, wherein the inversion register cell includes a first latch circuit storing by default the second logic state, and a second latch circuit for storing an inversion status bit stored in the inversion status cell.

7. The non-volatile memory of claim 6, wherein the inversion status register cell provides an output from a sense amplifier coupled to the inversion status cell as the read inversion signal.

8. The non-volatile memory of claim 6, wherein the inversion status register cell includes
   defect detection logic for providing the program inversion signal in response to detecting the second logic state of the inversion status cell or a defect signal indicative of the mismatch between the permanent logic state of the defective cell and a logic state of the bit of the input data to be programmed to the defective cell.

9. The non-volatile memory of claim 8, wherein the inversion status register cell further includes
   a reset circuit for setting the first latch circuit to store the second logic state, and a program data inversion circuit for inverting the bit of the input data in response to the program inversion signal.

* * * * *